(12) United States Patent
Liang et al.

(10) Patent No.: US 6,784,664 B2
(45) Date of Patent: Aug. 31, 2004

(54) FAST METHOD FOR DYNAMIC MR IMAGING

(75) Inventors: Zhi-Pei Liang, Champaign, IL (US); Norbert J. Pelc, Los Altos, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/317,462

(22) Filed: Dec. 11, 2002

(65) Prior Publication Data

US 2004/0113614 A1 Jun. 17, 2004

(51) Int. Cl.$^7$ ................................................ G01V 3/00
(52) U.S. Cl. ........................................ 324/309; 324/307
(58) Field of Search ................................. 324/309, 307, 324/306, 312, 300

(56) References Cited

U.S. PATENT DOCUMENTS 5,363,044 A * 11/1994 Xiang et al. ................. 324/309
5,653,233 A 8/1997 Pelc et al.
5,713,358 A * 2/1998 Mistretta et al. ............ 600/420
6,353,752 B1 3/2002 Madore et al.

OTHER PUBLICATIONS

B. Madore, N.J. Pelc, "A new way to perform 3D time–resolved angiography," proc. Intl. Soc. Mag. Reson. Med. 8 (2000), p. 697.

* cited by examiner

Primary Examiner—Louis Arana
(74) Attorney, Agent, or Firm—Beyer Weaver & Thomas LLP

(57) ABSTRACT

Generalized series-based image reconstruction as used in dynamic imaging for high-speed imaging with limited k-space coverage for each time frame. Further, in acquiring low resolution data for a plurality of image frames, a full k-space data set is generated for each time frame with the measured low-resolution data and high spatial frequency data generated by the GS model constructed based on the high-resolution image(s). The algorithms of the invention have computational complexity of O(N log N) and are capable of producing high-resolution dynamic images with a small number of Fourier transform samples.

10 Claims, 5 Drawing Sheets

FAST METHOD FOR DYNAMIC MR IMAGING

STATEMENT AS TO RIGHTS TO INVENTIONS MADE UNDER FEDERALLY SPONSORED RESEARCH OR DEVELOPMENT

The U.S. Government has rights in the disclosed invention pursuant to NIH Grant No. 1-R21-HL62336-01 and NIH Grant No. P41-RR09784.

CROSS-REFERENCES TO RELATED APPLICATIONS

NOT APPLICABLE.

REFERENCE TO A "SEQUENCE LISTING," A TABLE, OR A COMPUTER PROGRAM LISTING APPENDIX SUBMITTED ON A COMPACT DISK

NOT APPLICABLE.

BACKGROUND OF THE INVENTION

This invention relates generally to dynamic imaging, for example, using magnetic resonance (MR) techniques, and more particularly the invention relates to a fast method of image reconstruction using a generalized series for recovering unmeasured data in image reconstruction to enable high-speed imaging. The invention finds particular applications in imaging of time-varying object functions, for example, following wash-in/wash-out process of injected contrast agents, monitoring perfusion/diffusion changes in brain functional studies, and measuring relaxation times in multiple T1-weighted or T2-weighted experiments. However, the invention is also applicable to other imaging modalities including X-ray CT (computerized tomography), PET (positron emission tomography), and the like.

Many MR imaging applications require collecting a time series of images. Conventionally, these images are acquired independently, and as a result often compromise spatial resolution for high temporal resolution or short imaging time. To overcome this problem, several data-sharing methods have been proposed to improve imaging efficiency and speed. One such method relies on data sharing from one temporal frame to another, such as reduced encoded imaging by generalized series reconstruction or RIGR. A unique feature of this method is that one or more high resolution reference images and a sequence of reduced dynamic data sets (usually in central k-space) are collected. Assuming that N Fourier encodings are collected for the reference data set(s) and M encodings are collected for each of the dynamic data sets, a factor N/M improvement in temporal resolution is gained with this data acquisition scheme as compared to the convention full scan imaging method.

One known method, referred to as keyhole, fills in unmeasured high frequency data simply with the data from the data reference set or sets. The RIGR method recovers unmeasured data using the generalized series (GS) model, of which the basis functions are constructed based on the reference image(s). A key step in GS model-base image reconstruction is the determination of the series coefficients, which involve solving a set of linear equations. Although the computational problem is manageable for k-space data truncated only along one direction, it can present a significant problem for data sets truncated in multiple directions as often encountered in multidimensional imaging. To address this problem, a fast approximate solution has been proposed for application in 3D time-resolve angiography. See Madore and Pelc, "A new way to perform 3D time-resolve angiography," Proceedings of the Eighth Annual Meeting of ISMRM, Denver, 2000; p. 697.

The present invention provides a fast algorithm for reconstructing GS model-based images. The algorithm is stable, data consistent, and capable of capturing large signal variations with respect to the reference image(s).

BRIEF SUMMARY OF THE INVENTION

In accordance with the RIGR imaging scheme, one or more high-resolution reference images and a sequence of reduced dynamic data sets are collected.

In accordance with the basic generalized series (GS) model, a dynamic image I(x) is expressed as a product of a weighting function (determined from one or more high resolution reference images) and a local contrast modulation function, which is updated from one image frame to another. The contrast modulation function includes series coefficients which are determined by solving a set of linear equations.

In accordance with the invention, a fast algorithm finds an approximate solution for the sets of linear equations which are then used in GS model-based image reconstruction.

In accordance with another feature of the invention, the weighting function of the GS model is determined from the magnitude of the reference image(s), and a regularization constant is added to the weighting function to provide stability but without adversely affecting accuracy.

In accordance with yet another feature of the invention, the contrast modulation function is determined from the filtered Fourier transform of the dynamic data sets and synthetic Fourier data of the weighting function.

In accordance with yet another feature of the invention, the phase information of the reference images and measured dynamic data are utilized in every time frame along with the estimated data to thereby provide consistency of the reconstructed image.

The invention and objects and features thereof will be more readily apparent from the following detailed description and appended claims: when taken with the drawings.

DETAILED DESCRIPTION OF THE INVENTION

Figure 1:
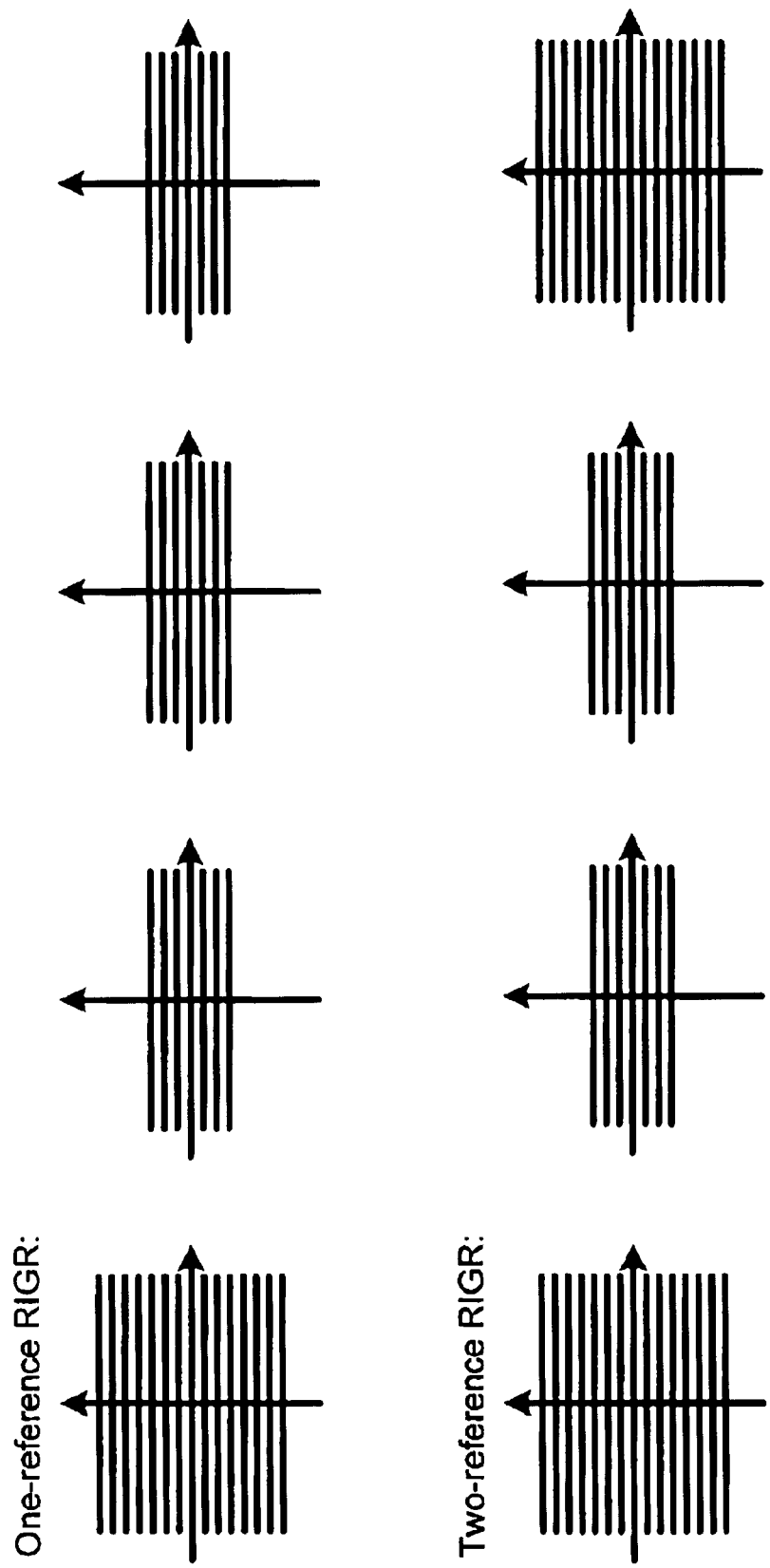
FIG. 1 shows the k-space sampling pattern of the RIGR imaging technique involving one or more high-reference data sets. The present invention can also handle k-space data sets collected in other patterns, such as radial, and spiral trajectories.

The basic aspects of magnetic resonance imaging (MRI), or imaging using MRI signals, are by now well understood. Spatial information is encoded into the acquired MRI signals using magnetic field gradients that are controlled by a pulse sequence program. Thus, each acquired signal is associated with a spatial encoding parameter. Generally, each acquired data point represents a sample of the Fourier transform of the imaged object. The function "space" in which the Fourier transform samples are defined is called "k-space." Often, the k-space samples are on a Cartesian grid and each pulse sequence repetition collects samples on one line in k-space. An important spatial encoding parameter in this case is the so-called phase encoding amplitude. In another MRI method, the samples collected in one pulse sequence repetition fall on spiral paths in k-space, and k-space is filled using multiple rotations of this spiral path. An important spatial encoding parameter in this case is the angular rotation of the spiral path.

Many imaging applications involve acquiring a time series of images. To improve imaging speed, several "data sharing" methods have been proposed which collect one or a few high resolution references and a sequence of reduced data sets. In image reconstruction, two methods, known as "keyhole" and RIGR (reduced encoding imaging by generalized series reconstruction), have been used. Keyhole fills in the unmeasured high frequency data simply with those from the reference data sets, whereas RIGR recovers the unmeasured data using a generalized series model, of which the basic functions are constructed based on the reference image or images. The present invention provides a fast algorithm for generalized series-based image reconstruction.

The basic GS model can be written in the following form:

$$I(\vec{x}) = w(\vec{x}) \sum_n c_n e^{-i2\pi \vec{k}_n \vec{x}} \quad (1)$$

where the weighting function $w(\vec{x})$ is chosen to absorb any available a priori information, and the series coefficients $c_n$ are chosen to assure that $I(\vec{x})$ is data-consistent. For example, $w(\vec{x})$ could be a high-resolution reference image and the second term provides a local contrast modulation. The optimality of the model can be justified from the principle of minimum cross-entropy, and some of its desirable properties have been discussed in the context of constrained image reconstruction.

A key step in GS model-based image reconstruction is the determination of the series coefficients $c_n$. Specifically, after $w(\vec{x})$ is chosen, $C_n$ can be determined by solving a set of linear equations in the following form:

$$Hc = d \quad (2)$$

where c and d are N-element vectors containing respectively the series of coefficients $c_n$ and the measured data $d_n$ with N being the total number of measured data points; and H is an N×N matrix (with a Toeplitz or block Toeplitz structure) constructed from the Fourier transform samples of the weighting function $w(\vec{x})$. For k-space data truncated only along one direction, Eq. (2) can be solved efficiently because H is relatively small (say 64×64) and has a Hermitian Toeplitz structure. For data sets truncated in multiple time-dependent directions (e.g. in 3D imaging), H is significantly larger (say, 4096×4096) and the Toeplitz structure is also lost; as a result, solving Eq. (2) directly could present a significant computational problem for online processing using computers in an MRI scanner. Building on the work in Madore and Pelc, Proceedings of 8th Annual Meeting of ISMRM, Denver, 2000, p. 297, we will first describe a fast algorithm for finding an approximate solution to Eq. (2) and then use it for GS model-based image reconstruction.

First, we rewrite the GS model in the following form:

$$I(\vec{x}) = w(\vec{x}) C(\vec{x}) \quad (3)$$

Where $$C(\vec{x}) = \sum_n c_n e^{-i2\pi \vec{k}_n \vec{x}}$$

is the contrast modulation function, which is to be updated from one frame to another. Let $\hat{I}(\vec{x}) = I(\vec{x}) * h(\vec{x})$ be the low-resolution Fourier reconstruction of $I(\vec{x})$ from the measured k-space data, where $h(\vec{x})$ is the point spread function of the data truncation window. We have $$\hat{I}(\vec{x}) = [w(\vec{x}) C(\vec{x})] * h(\vec{x}) \quad (4)$$

Invoking the inherent assumption in the GS model that $C(\vec{x})$ is a smooth function [in the sense that $C(\vec{x})$ does not vary significantly over any region of the shape and size of the effective spatial support of $h(\vec{x})$], we can factor $C(\vec{x})$ out of the convolution integral in Eq. (4). Consequently, we have $$\hat{I}(\vec{x}) \approx [w(\vec{x}) * h(\vec{x})] C(\vec{x}) = \hat{w}(\vec{x}) C(\vec{x}) \quad (5)$$

where $\hat{w}(\vec{x}) = w(\vec{x}) * h(\vec{x})$ is a low-resolution version of $w(\vec{x})$ which is obtained by discarding the high spatial frequency data that produced $w(\vec{x})$. From Eq. (5), we immediately obtain $$C(\vec{x}) = \frac{\hat{I}(\vec{x})}{\hat{w}(\vec{x})} \quad (6)$$

The above equation, first proposed by Madore and Pelc, supra, provides a fast way to evaluate $C(\vec{x})$ because the main computation here is the two FFTs used to calculate $\hat{I}(\vec{x})$ and $\hat{w}(\vec{x})$. In fact, for processing serial data sets, $\hat{w}(\vec{x})$ needs to be computed only once although $\hat{I}(\vec{x})$ has to be updated for each data frame.

The solution provided by Eq. (6) could be unstable due to division by zero (or numbers close to be zero). In accordance with a feature of the invention a straightforward way to deal with the problem is to add a "regularization" constant $\lambda$ to the magnitude of $\hat{w}(\vec{x})$ such that $$C(\vec{x}) = \frac{\hat{I}(\vec{x})}{[|\hat{w}(\vec{x})| + \lambda]e^{i\theta(\vec{x})}} \quad (7)$$

where $\theta(\vec{x})$ is the phase function of $\hat{w}(\vec{x})$. In practice, only the magnitude component of $C(\vec{x})$ is used (see Step (a) of the fast RIGR algorithm of the invention, as described below); we may, therefore, directly evaluate $C(\vec{x})$ as $$C(\vec{x}) = \frac{|\hat{I}(\vec{x})|}{|\hat{w}(\vec{x})| + \lambda} \quad (8)$$

Clearly, a large $\lambda$ will give a more stable $C(\vec{x})$ but at the expense of accuracy. We use a small $\lambda$ (say, $\lambda = 10^{-2} \mu$ with $\mu$ being the mean value of $|\hat{w}(\vec{x})|$. If necessary, a median filter can be applied afterward to remove any noise spikes resulting from small values in the denominator of Eq. (8). Some additional features of the invention have proved very useful for further improving the estimate of $C(\vec{x})$ (and avoiding spurious features in the resulting reconstruction). First, as in the original RIGR algorithm (see Liang and Lauterbur, IEEE Trans Med Imaging 1994; 13:677–686), it is desirable to choose a nonnegative function for $w(\vec{x})$. Second, to reduce Gibbs' ringing in $\hat{I}(\vec{x})$ and $\hat{w}(\vec{x})$, the Fourier data should be weighted with a window function (e.g., a mild Hamming window $H(k) = 0.8 + 0.2 \cos(\pi k/k_{max})$ in the 1D case, where it is assumed that measured data are available for $-k_{max} \leq k \leq k_{max}$) before the inverse FFT is applied.

After $C(\vec{x})$ is determined from Eq. (7), a GS model-based reconstruction can be generated from Eq. (3) directly. However, the reconstruction as calculated will not be data-consistent because of the approximation, regularization, and filtering used in the process. It is therefore often desirable to reinforce the data-consistency constraints by using the model-based reconstruction only for data extrapolation; that is, in this embodiment we use the model function in Eq. (3) to generate the unmeasured high-frequency data for a given dynamic data set so that a "full" data set is available for Fourier processing. In addition to assuring data consistency for the resulting reconstruction, the data extrapolation step will also allow us to reintroduce any valid phase constraints from the reference data to further improve resolution, another important feature of the invention. Based on the above discussion, a basic algorithm for GS model-based reconstruction and two extensions are presented below, in accordance with the invention.

A fast RIGR algorithm in accordance with the invention is applicable to the situation where a single high-resolution image $I_r(\vec{x})$ and a sequence of reduced k-space data sets: $d_q(\vec{k})$ for $1 \leq q \leq Q$, are collected. The algorithm requires estimation of the GS model function, data extrapolation, and FFT reconstruction, as follows:

(a) Estimation of the GS Model Function:

Set $w(\vec{x}) = |I_r(\vec{x})|$;

Calculate $C(\vec{x})$ according to Eq. (8).

Form a model-based reconstruction $I_{gs}(\vec{x})$ according to Eq. (3).

(Optional) Apply a median filter (with a 3×3 mask) to $C(\vec{x})$ or $I_{gs}(\vec{x})$.

(b) Data Extrapolation:

Introduce the reference phase $\theta_r(\vec{x})$ to $I_{gs}(\vec{x})$ such that $$\hat{I}_q(\vec{x}) = I_{gs}(\vec{x}) e^{i\theta_r(\vec{x})}.$$

Generate a full k-space data set $\hat{d}_q(\vec{k})$ from $\hat{I}_q(\vec{x})$.

Replace $\hat{d}_q(\vec{k})$ with $d_q(\vec{k})$ at the k-space locations where $d_q(\vec{k})$ is measured.

(c) FFT Reconstruction:

Apply the inverse FFT to the merged data set $\hat{d}_q(\vec{k})$ obtained in Step (b) to generate the final reconstruction.

In some dynamic imaging applications, it is possible to acquire two (or more) high-resolution images at different times of the dynamic imaging process. For example, in contrast-enhanced MRI, one can acquire a high-resolution pre-contrast image as the baseline reference and another high-resolution reference image after the rapid dynamic wash-in phase is completed. To reconstruct the dynamic images between the two references, two algorithms, known as TRIGR (Two-reference RIGR, (see Hanson et al., Magn Reson Med 1996; 36:172–175) and TRIGR+ (see Liang, Proceedings of Workshop on Minimum MR Data Acquisition Methods, Marco Island, Fla. 2001; 23–26), have been proposed. Based on the fast RIGR algorithm of the invention, we can reformulate the TRIGR and TRIGR+ algorithms as follows.

A fast TRIGR algorithm is applicable to the situation where two high-resolution references $I_{r,1}(\vec{x})$ and $I_{r,2}(\vec{x})$, and a sequence of reduced k-space data sets: $d_q(\vec{k})$ for $1 \leq q \leq Q$, are collected. It is further assumed that $I_{r,1}(\vec{x})$ can be treated as the baseline such that $I_{r,2}(\vec{x}) - I_{r,1}(\vec{x})$ highlights areas of dynamic signal variations. This assumption is often valid for contrast-enhanced MRI applications [8, 11].

(a) Set $\tilde{I}(\vec{x}) = I_{r,2}(\vec{x}) - I_{r,1}(\vec{x})$.

(b) Remove the baseline signal from the dynamic data sets: $\tilde{d}_q(\vec{k}) = d_q(\vec{k}) - d_{r,1}(\vec{k})$ for the measured $\vec{k}$ values and $1 \leq q \leq Q$.

(c) Feed $\tilde{I}_r(\vec{x})$ and $\tilde{d}_q(\vec{k})$ to the fast RIGR algorithm to obtain a GS model-based reconstruction.

(d) Add $I_{r,1}(\vec{x})$ to the image obtained in (c) to generate the final reconstruction.

The input to a fast TRIGR+ algorithm is the same as that to the TRIGR algorithm. However, here we no longer assume that one of reference images is a baseline scan. This algorithm is modified from the original TRIGR+ algorithm (see L. Cong, Supra) and can be applied to data with large signal variations from one image to another, such as in diffusion-weighted imaging with multiple diffusion weightings.

(a) Feed $I_{r,1}(\vec{x})$ and $d_q(\vec{k})$ to the fast RIGR algorithm to obtain $I_{q,1}(\vec{x})$.

(b) Feed $I_{r,2}(\vec{x})$ and $d_q(\vec{k})$ to the fast RIGR algorithm to obtain $I_{q,2}(\vec{x})$.

(c) Set $I_q(\vec{x}) = \alpha I_{q,1}(\vec{x}) + (1-\alpha) I_{q,2}(\vec{x})$, where a $\alpha = e_2/(e_1 + e_2)$ with $e_1 = \|d_q(\vec{k}) - d_{r,1}(\vec{k})\|_2$ and $e_2 = \|d_q(\vec{k}) - d_{r,2}(\vec{k})\|_2$.

Here it is understood that $\|\cdot\|_2$ is defined over the set of $\vec{k}$ values at which $d_q(\vec{k})$ is measured.

It is useful to state some known results before we analyze the computational complexity of the proposed algorithms of the invention:

The computational complexity of an N-point FFT is $O(N \log N)$.

The computational complexity of solving a Hermitian Toeplitz system of N simultaneous equations in N unknowns is $O(N \log N)$ [The Levinson algorithm has a complexity of $O(N^2)$].

The computational complexity of solving an arbitrary system of N simultaneous equations in N unknowns is $O(N^3)$ [or more precisely, $O(N^p)$ for $2<p\leq 3$].

The proposed fast RIGR algorithm (and its extensions) is an FFT-based algorithm, and it is easy to show that its computational complexity is $O(N \log N)$ for processing a single 1D single with N being the number of reference encodings. For processing a 2D data set with M columns, the overall computational complexity is $O(MN \log N)$ or $O(N^2 \log N)$ if M=N. Therefore, the computational complexity of the proposed fast RIGR algorithm is essentially the same as that of the Keyhole algorithm, although Keyhole may require fewer FFTs than the proposed fast RIGR algorithm. The same can be said about the fast TRIGR and TRIGR+ algorithms.

The original RIGR algorithm (and its variants) involves solving Eq. (2). In the case of 1D data truncation, the coefficient matrix H has a Hermitian Toeplitz structure, and Eq. (2) can be solved in $O(L \log L)$ operations or $O(L^2)$ operations if the Levinson algorithm is used [14], where L is the number of dynamic encodings. With the solution of Eq. (2), $O(N \log N)$ operations are needed to evaluate $I(\vec{x})$ in Eq. (3), where N is the number of reference encodings. Noting that N>L in this case, the overall computational complexity of the original RIGR algorithm can be expressed simply as $O(N \log N)$, or $O(MN \log N)$, for processing a 2D data set of M columns, which is similar to that of the proposed fast RIGR algorithm or the Keyhole algorithm. Therefore, there is no significant computational advantage (or penalty) of the proposed fast RIGR algorithm over the original RIGR algorithm for data sets with ID truncation.

The situation, however, is drastically different for processing data sets truncated in multiple directions. For example, for a 2D dynamic data set with $L_x \times L_y$ encodings, H is an LxL matrix with $L=L_xL_y$. Although H has a block Toeplitz structure, Eq. (2) is often solved using a general linear system solver and, therefore, the computational complexity of the RIGR algorithm is, in this case, approximately $O(L^3)$. In contrast, the computational complexity of the proposed algorithm(s) is $O(N^2 \log N)$ assuming that the reference data set has N×N encodings. Because L is on the order of or much larger than N, the reduction in computational complexity by the proposed algorithm(s) is very significant; for example, for L=16×16=256 and N=256, $$\frac{L^3}{N^2 \log N} = 32.$$

The running time of an algorithm is dependent on its implementation and the computing platform used. Nevertheless, with the significantly reduced computational complexity, the proposed fast RIGR algorithm (and its extensions) are expected to offer a significant speedup in GS model-based image reconstruction over the original algorithms for data sets truncated in multiple directions. We have observed up to a factor of ten speed-ups by the proposed algorithms in running our unoptimized Matlab implementation of the algorithms.

Following are some representative results from practical imaging data to demonstrate the effectiveness of the algorithms in accordance with the invention.

Figure 2:
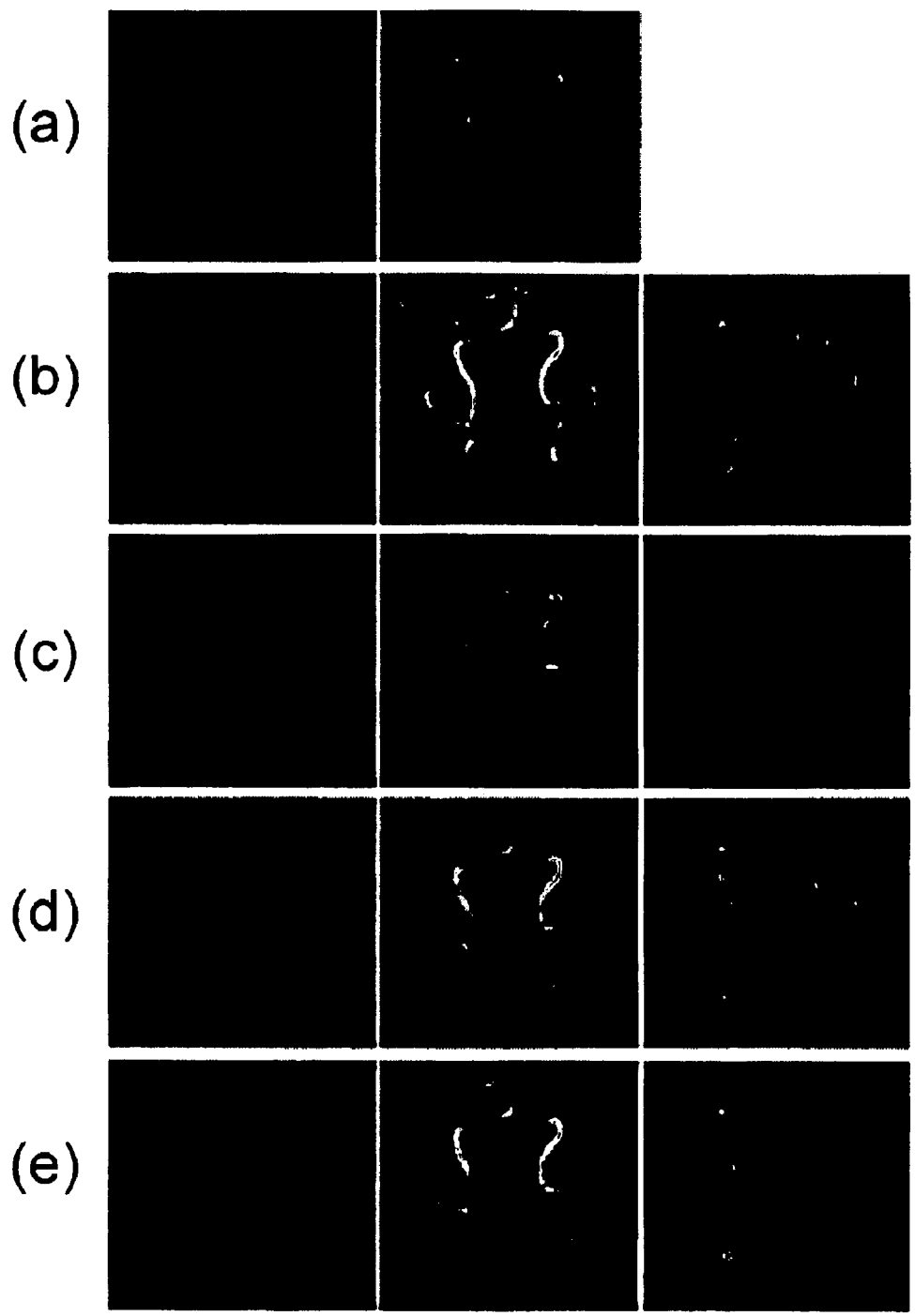
FIGS. 2(a)–(e) are images attained in a contrast-enhanced angiographic image experiment including (a) pre-injection and post-injection reference images; (b) high resolution post-injection Fourier images reconstructed from 144 phase encodings; (c) keyhole reconstructions from 16 phase encodings using; the second image in (a) as the reference; (d) GS model-based reconstructions from the same data set in (c) using the fast algorithm of the present invention; and (e) GS model-based reconstruction using prior art TRIGR (two reference reduced-encoding imaging by generalized-series reconstruction) algorithm.
Figure 3:
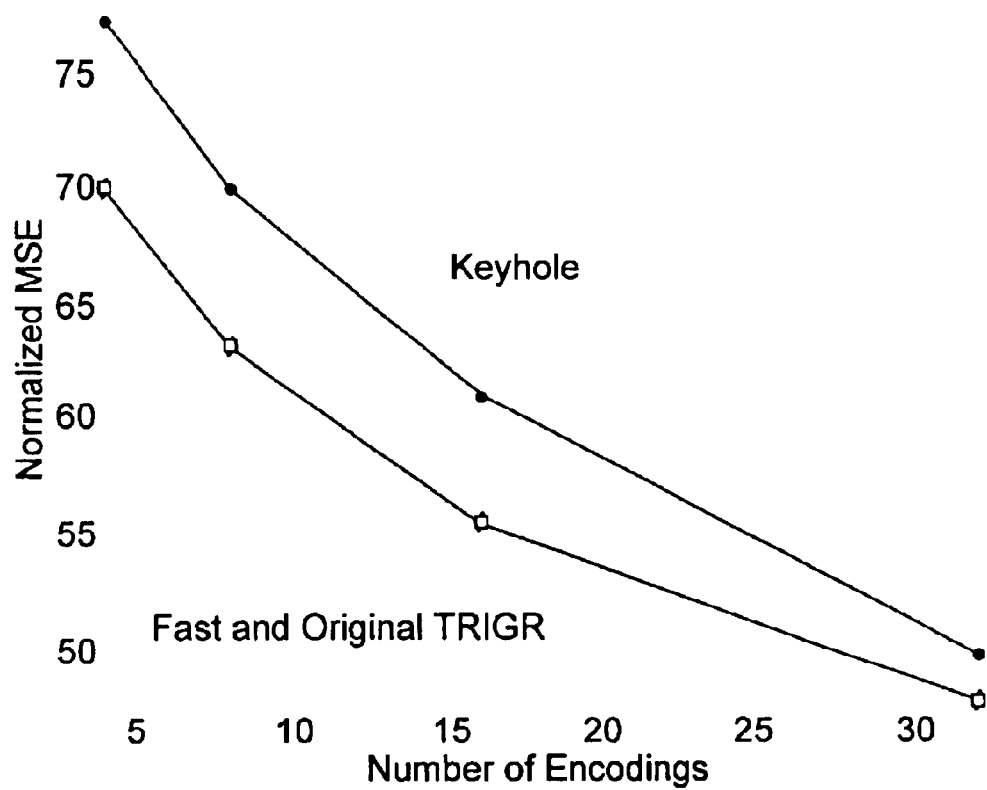
FIG. 3 is a graph of reconstruction errors normalized against the energy of high-resolution Fourier images for Keyhole and for Fast and Original TRIGR.

The first data set was acquired using a fast gradient-echo sequence following intravenous administration of a contrast agent. We started with a full data set consisting of 20 temporal data frames, each with 144 phase-encoded echo signals. As the echoes are asymmetric (with 26 and 128 data points respectively before and after the echo peak), we used a projection-onto-convex-sets algorithm for partial-Fourier reconstruction along the readout direction (the vertical direction in FIG. 2). To test the proposed algorithms, a large portion of the acquired data was discarded, and two high-resolution images (top row of FIG. 2), were used as the reference, of which the first is a pre-injection image and the second is a post-injection image acquired at the end of the scan. FIGS. 2b–e shows a set of reconstructions from several algorithms at three time points during transit of the contrast. The Fourier reconstructions from the full data set (FIG. 2b) are also included as the gold standard. As can be seen from FIG. 2c, the Keyhole reconstructions with 16 phase encodings contain noticeable reconstruction errors (over-enhancements of blood vessels in the first image and under-enhancements in the second image). These artifacts were significantly reduced in the GS model-based reconstructions produced by both the proposed fast TRIGR algorithm (FIG. 2d) and the original TRIGR algorithm (FIG. 2e). In fact, there is no noticeable difference in image quality between FIGS. 2d and e. This observation is consistent with the results shown in FIG. 3, which indicates that the proposed fast TRIGR algorithm performs as well as the original TRIGR algorithm for different levels of data truncation of this data set.

The second data set was obtained from a diffusion-weighted imaging experiment, where "dynamic" signal changes were caused by varying the amplitude of a diffusion-weighting gradient. This data set was chosen to test how well the algorithms handle large signal variations with respect to the reference(s).

Figure 4:
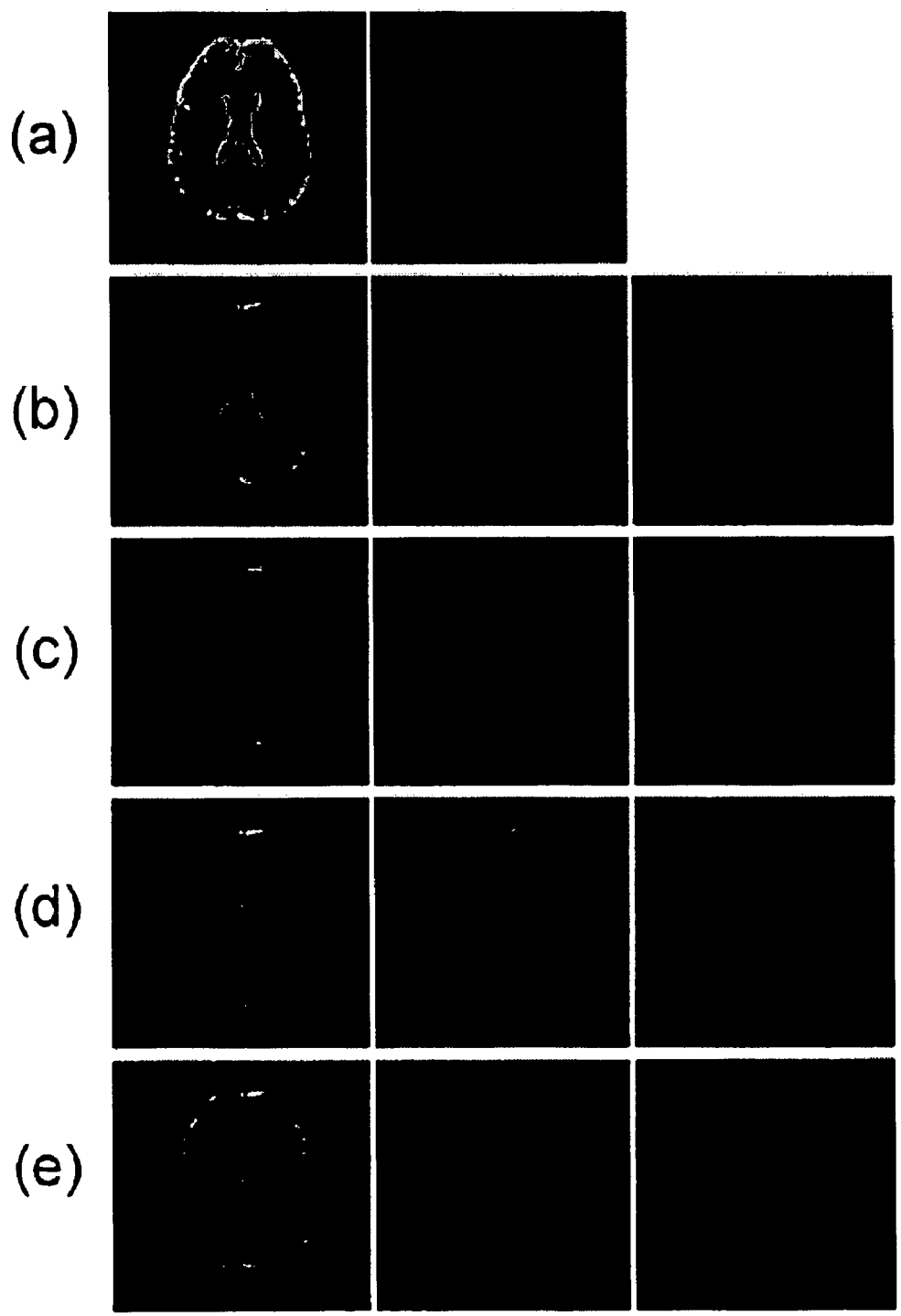
FIGS. 4(a)–(e) are diffusion-weighted images acquired with a variable diffusion-weighting gradient: (a) Two high-resolution reference images; (b) High-resolution Fourier images reconstructed from 128 phase encodings (horizontal direction); (c) Keyhole reconstructions from 16 phase encodings using the second image in (a) as the reference; (d) GS model-based reconstructions from the same data set in (c) using the fast TRIGR+ algorithm of the invention, and (e) GS model-based reconstructions using the original TRIGR+ algorithm.
Figure 5:
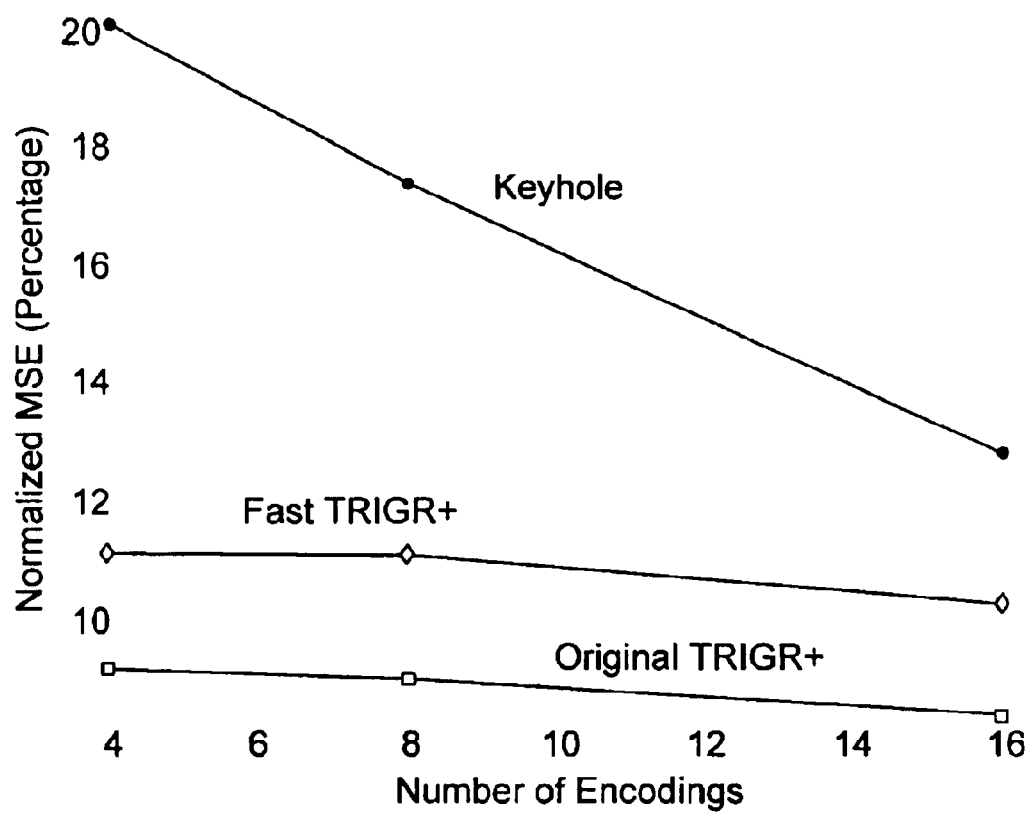
FIG. 5 is a graph illustrating reconstruction errors normalized against the energy of high-resolution Fourier images for Keyhole, Fast TRIGR, and Original TRIGR.

FIG. 4a shows two high-resolution references, one acquired with a minimum diffusion weighting and the other with a heavy diffusion weighting. FIGS. 4c–e shows the reconstructions of three diffusion-weighted images from 16 phase-encoded signals using Keyhole and the GS model-based methods. For comparison, the corresponding high-resolution Fourier images reconstructed from 128 phase-encoded signals are also included (FIG. 4b). As can be seen, the Keyhole reconstructions (FIG. 4c) show significant image blurring because of large "dynamic" signal variations from the reference [the second image in (3a)] Keyhole reconstructions using the first reference are not shown here as they contain stronger artifacts. This blurring artifact was significantly reduced in the GS model-based reconstructions produced by both the original and fast TRIGR+ algorithms (FIGS. 4d–e). FIG. 5 shows the reconstruction error curves calculated from the entire diffusion-weighted data set with 6 frames. As expected, the TRIGR algorithms have smaller reconstruction errors than Keyhole. Note also that the reconstruction error of the fast TRIGR+ algorithm is slightly higher than that of the original TRIGR+ algorithm because the smoothness assumption made in Eq. (5) is violated in this application. The fast algorithms of the invention would seem to be more ideal in contrast-enhanced applications (e.g. FIG. 2), where the contrast modulation function C(x) is intrinsically smooth and the assumption made in Eq. (5) holds well, than in the diffusion application (FIG. 4).

The GS model is an optimal way (according to the minimum cross-entropy principle) to solve the image reconstruction problem in data-sharing Fourier imaging. The invention includes three related fast algorithms for calculating GS model-based reconstructions. Experimental results indicate that the proposed algorithms can produce images of higher quality than those from the Keyhole algorithm and comparable to those by the original GS model-based algorithms. The proposed algorithms, having the same computational complexity as the Keyhole algorithm make the GS model more practical for processing k-space data truncated in multiple directions.

While the invention has been described with reference to specific applications, the description is illustrative of the invention and is not limiting the invention. Various applications and modifications may occur to those skilled in the art without departing from the true scope and spirit of the invention as defined by the appended claims.

What is claimed is:

1. A method of image reconstruction for fast dynamic imaging using a generalized-series (GS) model comprising the steps of:

a) acquiring data for at least one high resolution reference image, $I_r(\vec{x})$, b) acquiring one or more dynamic k-space data sets, $d_q(\vec{k})$, for one or more image datasets, q, where $1 \leq q \leq Q$, c) determining an image weighting function $w(\vec{x})$ based on the reference image(s), d) determining a contrast modulation function, $C(\vec{x})$, for each data frame to absorb dynamic signal variations, e) multiplying the weighting function $w(\vec{x})$ by the contrast modulation function, $C(\vec{x})$, to obtain an initial estimate of the image for each time point, f) using the initial estimate obtained in step e) and phase information from the reference image(s) to estimate a full k-space data set, g) replacing estimated k-space data obtained in step e) with the acquired data in step b) at the k-space locations where $d_q(\vec{k})$ is acquired to achieve data consistency in a merged data set, and h) Fourier transforming the merged data set obtained in step g) to generate the desired image function.

2. The method as defined by claim 1 wherein in step a) the reference data are collected using standard phase-encoding or frequency-encoding methods, and the number of encodings is determined by desired spatial resolution.

3. The method as defined by claim 1 wherein in step b) the dynamic data sets are collected using the standard phase-encoding or frequency-encoding methods, spiral scanning methods, and the number of encodings is determined by desired temporal resolution of the experiment.

4. The method as defined by claim 1 wherein in step c) the weighting function is taken as the magnitude of the reference image or as the magnitude of the difference between two references.

5. The method as defined by claim 1 wherein in step d) the contrast modulation function is given by $$C(\vec{x}) = \frac{|\hat{I}(\vec{x})|}{|\hat{w}(\vec{x})|},$$

with a) $\hat{I}(\vec{x})$ being the low-resolution Fourier reconstruction of $I_q(\vec{x})$ from the measured k-space data $d_q(\vec{k})$; and b) $\hat{w}(\vec{x})$ being the low-resolution version of $w(\vec{x})$, which is obtained by discarding the high spatial frequency data that produced $w(\vec{x})$.

6. The method as defined by claim 1 wherein in step d) the contrast modulation function is given by $$C(\vec{x}) = \frac{|\hat{I}(\vec{x})|}{|\hat{w}(\vec{x})| + \lambda},$$

with a) $\hat{I}(\vec{x})$ being the low-resolution Fourier reconstruction of $I_q(\vec{x})$ from the measured k-space data $d_q(\vec{k})$;

b) $\hat{w}(\vec{x})$ being the low-resolution version of $w(\vec{x})$, which is obtained by discarding the high spatial frequency data that produced $w(\vec{x})$; and c) $\lambda$ being a regularization constant.

7. The method as defined by claim 6 wherein $\lambda$ being a regularization constant whose value is roughly $10^{-2}\mu$ where $\mu$ is the mean value of $|\hat{w}(\vec{x})|$.

8. The method as defined by claim 1 wherein in step a) two high resolution images, $I_{r,1}(\vec{x})$ and $I_{r,2}(\vec{x})$, are acquired at different times with $I_{r,1}(\vec{x})$ being a base-line image; wherein in step c) the weighting function is chosen to be $|I_{r,2}(\vec{x}) - I_{r,1}(\vec{x})|$; in step d) the contrast modulation function is determined from $\tilde{d}_q(\vec{k}) = d_q(\vec{k}) - d_{r,1}(\vec{k})$, and in step h) $I_{r,1}(\vec{x})$ is added to the reconstruction of the desired image function to produce the final image for each temporal frame.

9. The method as defined by claim 1 wherein in step a) two high resolution images, $I_{r,1}(\vec{x})$ and $I_{r,2}(\vec{x})$ are acquired at different times; two GS model-based reconstructions are produced by using $|I_{r,1}(\vec{x})|$ and $|I_{r,2}(\vec{x})|$, respectively, as the weighting function, and the final reconstruction is determined as a weighted sum of the two reconstructions.

10. The method as defined by claim 9 where the weighting coefficients are determined according to $\|d_q(\vec{k}) - d_{r,1}(\vec{k})\|_2$ and $\|d_q(\vec{k}) - d_{r,2}(\vec{k})\|_2$.

* * * * *